United States Patent
Akai et al.

[11] Patent Number: 5,973,987
[45] Date of Patent: Oct. 26, 1999

[54] SEMICONDUCTOR MEMORY DEVICE DELAYING ATD PULSE SIGNAL TO GENERATE WORD LINE ACTIVATION SIGNAL

[75] Inventors: Kiyoyasu Akai; Masayuki Yamashita; Motoi Ashida, all of Hyogo, Japan

[73] Assignee: Mitsubishi Denki Kabushiki Kaisha, Tokyo, Japan

[21] Appl. No.: 09/267,161

[22] Filed: Mar. 12, 1999

[30] Foreign Application Priority Data

Aug. 28, 1998 [JP] Japan ................................. 10-243559

[51] Int. Cl.⁶ ........................................... G11C 8/00
[52] U.S. Cl. .................. 365/230.06; 365/194; 365/233.5
[58] Field of Search ............... 365/230.06, 194, 365/233.5, 230.08

[56] References Cited

U.S. PATENT DOCUMENTS

| | | |
|---|---|---|
| 5,323,360 | 6/1994 | Pelley et al. ........................... 365/233.5 |
| 5,414,672 | 5/1995 | Ozeki et al. ........................... 365/233.5 |
| 5,457,661 | 10/1995 | Tomita et al. ........................ 365/233.5 |
| 5,608,688 | 3/1997 | Park ..................................... 365/233.5 |
| 5,636,177 | 6/1997 | Fu ......................................... 365/233.5 |
| 5,719,812 | 2/1998 | Seki et al. .............................. 365/194 |

FOREIGN PATENT DOCUMENTS 6-103775  4/1994  Japan .

Primary Examiner—David Nelms
Assistant Examiner—Hien Nguyen
Attorney, Agent, or Firm—McDermott, Will & Emery

[57] ABSTRACT

A word line activation signal generated by a timing generator is surely at L level in a prescribed period regardless of the power supply voltage. A row address signal delayed by a delay circuit in a row address buffer changes in a period in which the word line activation signal is at L level. Accordingly, even if skew occurs, a non-selected word line is never activated. Consequently, it is possible to prevent delay of access to a memory cell and erroneous writing to a memory cell.

9 Claims, 18 Drawing Sheets

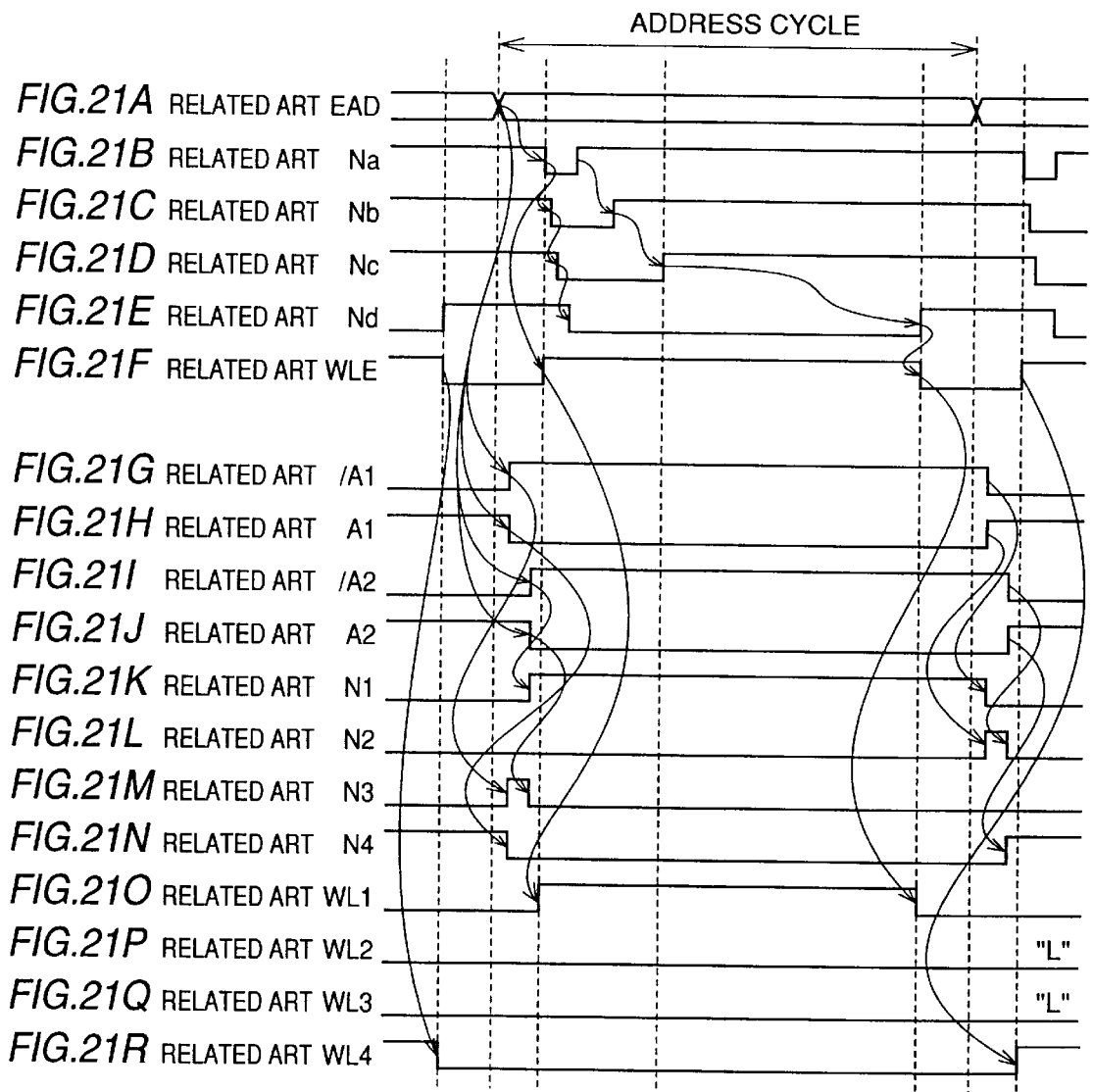

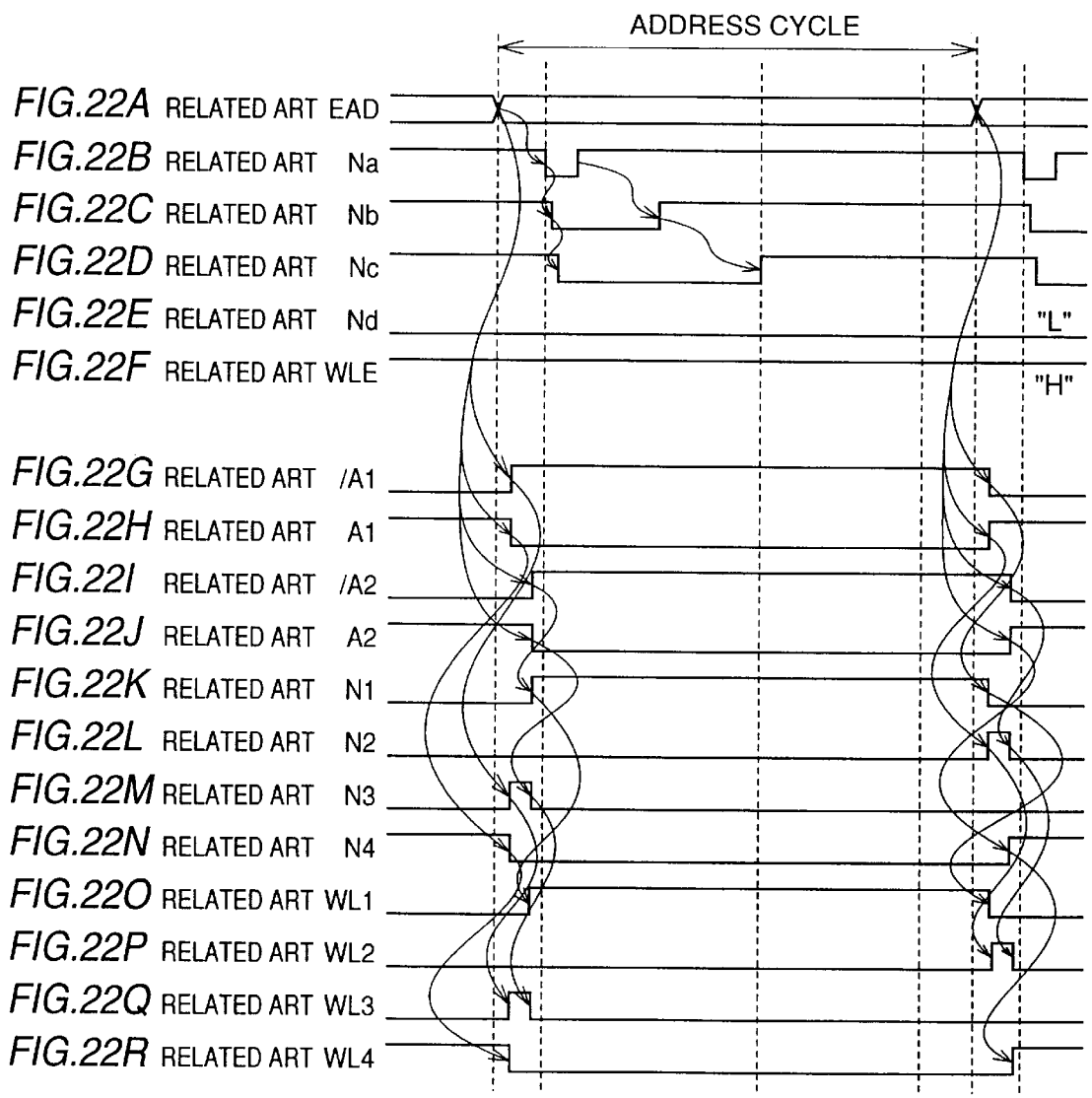

SEMICONDUCTOR MEMORY DEVICE DELAYING ATD PULSE SIGNAL TO GENERATE WORD LINE ACTIVATION SIGNAL

BACKGROUND OF THE INVENTION

1. Field of the Invention

The present invention relates to a semiconductor memory device, and more particularly, to a semiconductor memory device that delays a pulse signal from an ATD (Address Transition Detection) buffer to generate a word line activation signal.

2. Description of the Background Art

In the semiconductor memory device referred to as asynchronous SRAM (Static Random Access Memory), ATD buffers are provided at various places that generate a one-shot pulse signal according to change of an address signal, a chip select signal, a read/write enable signal, and an input data signal. A word line activation signal WLE is generated by a timing generator that delays the trailing edge of a pulse signal supplied from the ATD buffer as illustrated in FIG. 17.

A pulse signal LATD1 input to the timing generator is generated in response to change of a row address signal by an ATD buffer provided for a row address buffer, and an ATD signal LATD2 is generated in response to change of a column address signal by an ATD buffer provided for a column address buffer. FIG. 18 is a block diagram illustrating a structure of an address buffer (row address buffer or column address buffer). The address buffer generates internal address signals A and /A in response to an external address signal EAD when a chip select signal /CS is active (at a logical low level), and an address signal atd is supplied to a corresponding ATD buffer.

Word line activation signal WLE is supplied to a row decoder shown in FIG. 19. The row decoder selectively activates word lines WL1–WL4 in response to internal address signals A1, /A1, A2, and /A2 when word line activation signal WLE is active (at a logical high level).

The timing generator generally includes multiple stages of delay circuits RDLs as shown in FIG. 17. The pulse width of a signal output from delay circuit RDL remarkably increases as the power supply voltage decreases as indicated by (2) of FIG. 20.

FIGS. 21A–21R represents internal waveforms of the SRAM in the case that the power supply voltage is relatively high. Referring to FIGS. 21A–21R, if the power supply voltage is high, the pulse width of delay circuit RDL is relatively small, and the pulse width of word line activation signal WLE is accordingly in the range of an address cycle. In this case, even if there is skew between internal address signals A1 and A2 to cause nodes N2 and N3 corresponding to non-selected addresses to rise, word lines WL2 and WL3 corresponding to the skew addresses do not rise since word line activation signal WLE is at a logical low or L level.

The current trend of miniaturization and reduced voltage of a semiconductor memory device requires that the operation of the memory device is ensured on one chip in a range of a higher supply voltage to a lower supply voltage.

The internal waveforms of the SRAM represented by FIGS. 21A–21R in the case of the higher supply voltage change to those internal waveforms represented by FIGS. 22A–22R if the supply voltage of the SRAM is low. As the supply voltage decreases, the pulse width of the pulse signal output from delay circuit RDL remarkably increases as shown in FIG. 20. Therefore, the pulse width of word line activation signal WLE exceeds the address cycle and word line activation signal WLE is fixed at a logical high or H level.

In this case, if there is skew between internal address signals A1 and A2, nodes N2 and N3 corresponding to non-selected addresses rise. Word line activation signal WLE fixed at H level thus causes word lines WL2 and WL3 corresponding to skew addresses, in addition to selected word lines WL1 and WL4, to rise.

Since word lines WL2 and WL3 corresponding to the skew addresses rise, it follows that data could be read at this instant from memory cells corresponding to the skew addresses, to delay access to a memory cell corresponding to a selected address. Further, in the case of the write cycle, writing could be done wrongly.

SUMMARY OF THE INVENTION

The present invention is made to solve such a problem as described above. One object of the present invention is to provide a semiconductor memory device that can prevent delay of access to a memory cell and erroneous writing to a memory cell in a range of a higher supply voltage to a lower supply voltage.

A semiconductor memory device according to the present invention includes a memory cell array, an address buffer, an address change detect circuit, a first delay circuit, a drive signal inactivate circuit, and a decoder. The memory cell array includes a plurality of memory cells arranged in rows and columns. The address buffer generates an internal address signal in response to an external address signal. The address change detect circuit generates a pulse signal in response to change of the external address signal. The first delay circuit delays the trailing edge of the pulse signal from the address change detect circuit to generate a drive signal. The drive signal inactivate circuit inactivates the drive signal for a prescribed period. The decoder selects a row or column of the memory cell array in response to the internal address signal when the drive signal is active. The address buffer includes a second delay circuit. The second delay circuit delays the external address signal for a prescribed period to output it as an internal address signal such that the internal address signal changes during the period in which the drive signal is inactive.

In the semiconductor memory device described above, the drive signal is surely rendered inactive for a prescribed period regardless of the supply voltage, and during the inactive period of the drive signal, the internal address signal changes. Therefore, even if there is skew between internal address signals, a row or column corresponding to any skew address is never selected by a row decoder. As a result, reading of data at an instant from a memory cell corresponding to the skew address never happens and delay of access to a memory cell and an erroneous writing to a memory cell can be prevented in a range of a higher supply voltage to a lower supply voltage.

Preferably, the first delay circuit includes multiple stages of delay circuits and the drive signal inactivate circuit includes a logic circuit. The multiple stages of delay circuits delay the trailing edge of a pulse signal from the address change detect circuit. The logic circuit receives an output from one of the multiple stages of delay circuits that is placed in an intermediate stage and receives an output from a delay circuit in the last stage.

In the semiconductor memory device described above, the logic circuit generates a drive signal which is inactive during the period from the leading edge of the pulse signal from the address change detect circuit to the trailing edge of the output from the delay circuit in the intermediate stage of the multiple stages of delay circuits. The internal address signal changes in the inactive period of the drive signal. Therefore, even if skew occurs between internal address signals, a row or column corresponding to a skew address is never selected by a row decoder. As a result, reading of data at an instant from a memory cell corresponding to the skew address never happens and delay of access to a memory cell and incorrect writing to a memory cell can be prevented.

Preferably, the semiconductor memory device further includes a third delay circuit. The third delay circuit delays a chip select signal for a prescribed period to output it such that the delayed chip select signal as the output signal changes in the inactive period of the drive signal. The address buffer generates the internal address signal in response to the external address signal when the chip select signal is active, and fixes the internal address signal when the chip select signal is inactive. The decoder selects a row or column of the memory cell array in response to the internal address signal when the delayed chip select signal and the drive signal are active.

In the semiconductor memory device described above, the delayed chip select signal changes in the inactive period of the drive signal to prevent a row or column corresponding to the fixed internal address signal from being selected by the row decoder. Accordingly, it is possible to prevent delay of access to an memory cell and erroneous writing to a memory cell.

Preferably, the semiconductor memory device further includes a fourth delay circuit and an output buffer. The fourth delay circuit delays a read/write enable signal for a prescribed period to output it such that the delayed read/write enable signal as the output signal changes in the inactive period of the drive signal. The output buffer buffers a data signal from a memory cell when the delayed read/write enable signal is active to output the buffered one.

In the semiconductor memory device described above, since the delayed read/write enable signal changes in the inactive period of the drive signal, the data signal is output from the output buffer after the internal address signal is defined.

Preferably, the semiconductor memory device further includes a fourth delay circuit and an input buffer. The fourth delay circuit delays a read/write enable signal for a prescribed period to output it such that the delayed read/write enable signal as the output signal changes in the inactive period of the drive signal. The input buffer buffers an externally supplied data signal when the delayed read/write enable signal is active.

In the semiconductor memory device described above, since the delayed read/write enable signal changes in the inactive period of the drive signal, the data signal is written from the input buffer into a memory cell after the internal address signal is defined. Accordingly, delay of access to a memory cell and incorrect writing can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 21A–21R are timing charts representing an operation of the conventional SRAM in the case that the supply voltage is high.

FIGS. 22A–22R are timing charts representing an operation of the conventional SRAM in the case that the supply voltage is low.

DESCRIPTION OF THE PREFERRED EMBODIMENTS

Figure 1:
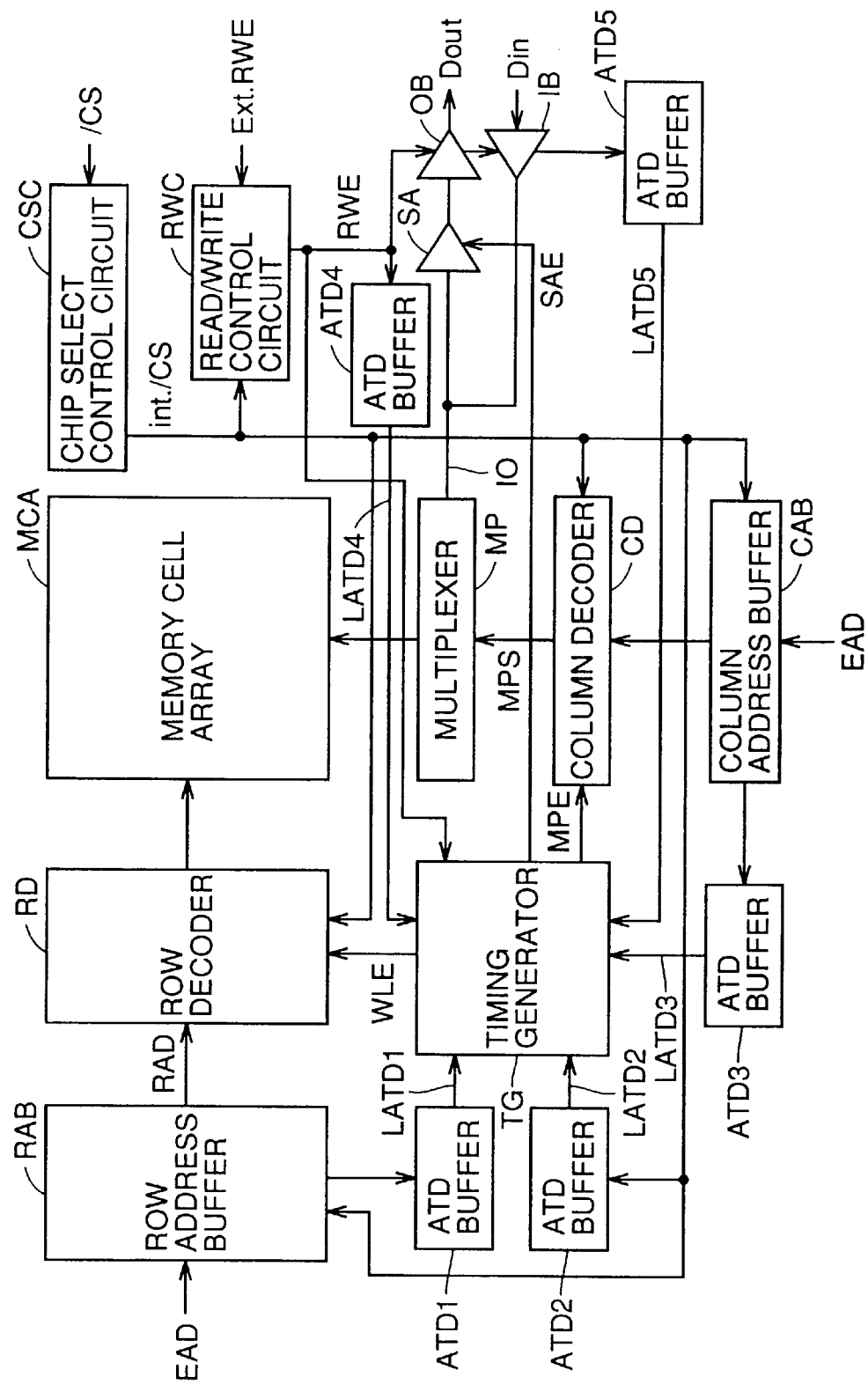
FIG. 1 is a block diagram illustrating an entire structure of an SRAM according to the first embodiment of the invention.

Embodiments of the present invention are hereinafter described in detail in conjunction with the attached drawings. The same component or a corresponding one has the same reference character and description thereof is not repeated.

[First Embodiment]

FIG. 1 is a block diagram illustrating an entire structure of an SRAM according to the first embodiment of the present invention. Referring to FIG. 1, the SRAM includes a memory cell array MCA, a row address buffer RAB, a column address buffer CAB, a row decoder RD, a column decoder CD, a timing generator TG, a multiplexer MP, a sense amplifier SA, an output data buffer OB, an input data buffer IB, a read/write control circuit RWC, a chip select control circuit CSC, and ATD buffers ATD1–ATD5.

Memory cell array MCA includes a plurality of memory cells (not shown) arranged in rows and columns, a plurality of word lines (not shown) arranged in rows, and a plurality of bit line pairs (not shown) arranged in columns. Chip select control circuit CSC generates an internal chip select signal int. /CS in response to an external chip select signal /CS. Row address buffer RAB outputs a row address signal RAD in response to an external address signal EAD. Column address buffer CAB outputs a column address signal CAD in response to external address signal EAD. Row decoder RD selectively activates a word line in response to row address signal RAD. Column decoder CD outputs a multiplexer select signal MPS in response to column address signal CAD. Read/write control circuit RWC generates a read/write enable signal RWE in response to an external read/write enable signal Ext. RWE. ATD buffers ATD1–ATD5 respectively generate one-shot pulse signals LATD1–LATD5 according to change of row address signal RAD, internal chip select signal int. /CS, column address signal CAD, read/write enable signal RWE, and a data input signal Din. Timing generator TG generates a word line activation signal WLE, a multiplexer activation signal MPE, and a sense amplifier activation signal SAE from pulse signals LATD1–LATD5. Multiplexer MP connects or does not connect a bit line pair and a data input/output line pair IO corresponding to each other in response to multiplexer select signal MPS from column decoder CD. Sense amplifier SA amplifies a data signal of a memory cell array read onto data input/output line pair IO when sense amplifier activation signal SAE is active. Output data buffer OB amplifies an output from sense amplifier SA to output it as a data output signal Dout to any external unit of the SRAM when read/write enable signal RWE is active.

Figure 2:
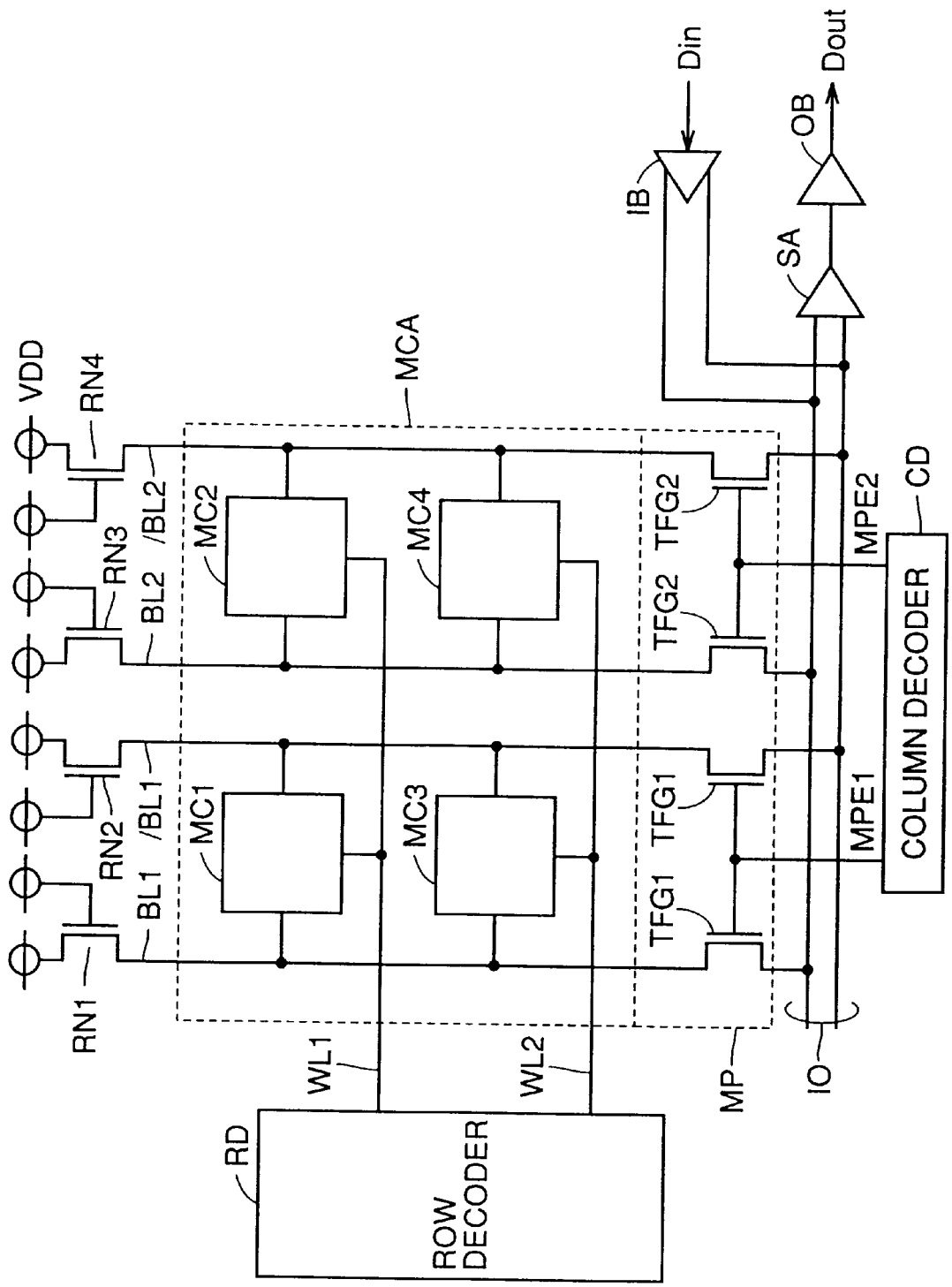
FIG. 2 is a block diagram illustrating structures of a memory cell array and a multiplexer shown in FIG. 1.

FIG. 2 is a block diagram illustrating structures of memory cell array MCA and multiplexer MP shown in FIG. 1 in detail. Memory cell array MCA is shown having the structure formed of two rows and two columns for purpose of simplicity.

Referring to FIG. 2, memory cell array MCA includes memory cells MC1–MC4, word lines WL1 and WL2, and bit line pairs BL1 and BL1, and BL2 and /BL2. Memory cells MC1 and MC2 are provided for word line WL1, and memory cells MC3 and MC4 are provided for word line WL2. Memory cells MC1 and MC3 are provided for bit line pair BL1 and /BL1, and memory cells MC2 and MC4 are provided for bit line pair BL2 and /BL2. N channel MOS transistors RN1–RN4 each as the load of the bit line are respectively connected to the ends of bit lines BL1, /BL1, BL2, and /BL2 on one side. N channel MOS transistors RN1–RN4 are diode-connected, and connected between power supply node VDD and corresponding bit lines BL1, /BL1, BL2, and /BL2.

Multiplexer MP includes N channel MOS transistors TFG1 and TFG2. N channel MOS transistors TFG1 and TFG2 respectively constitute transfer gates, and are turned on/off in response to multiplexer activation signals MPE1 and MPE2 from the column decoder. According to ON/OFF of the transfer gates, corresponding bit line pairs BL1 and /BL1 as well as BL2 and /BL2 are connected or not connected to input/output line pair IO.

Figure 3:
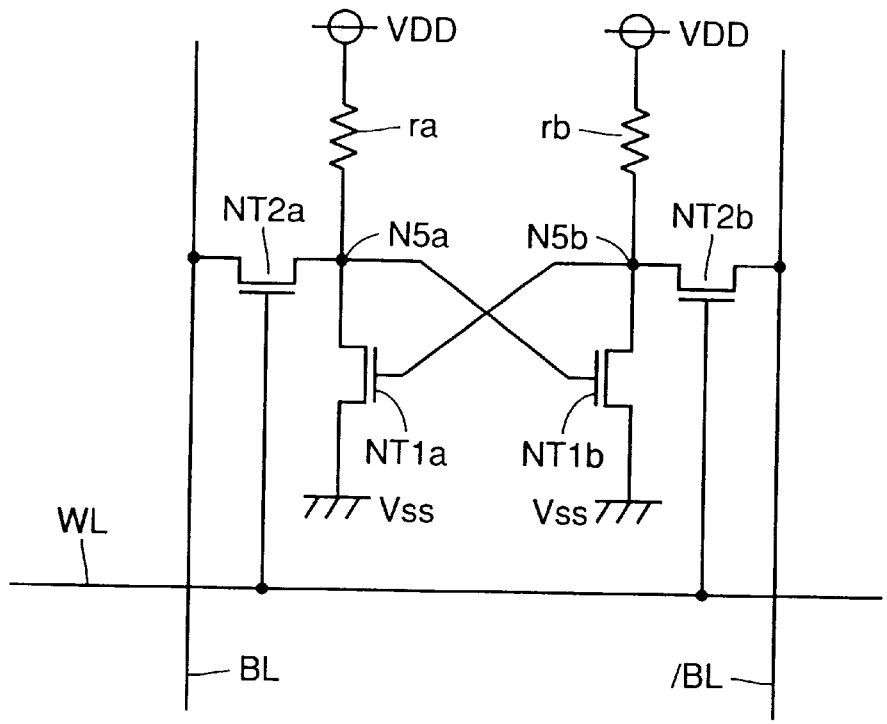
FIG. 3 is a circuit diagram illustrating a structure of a memory cell shown in FIG. 2.
Figure 4:
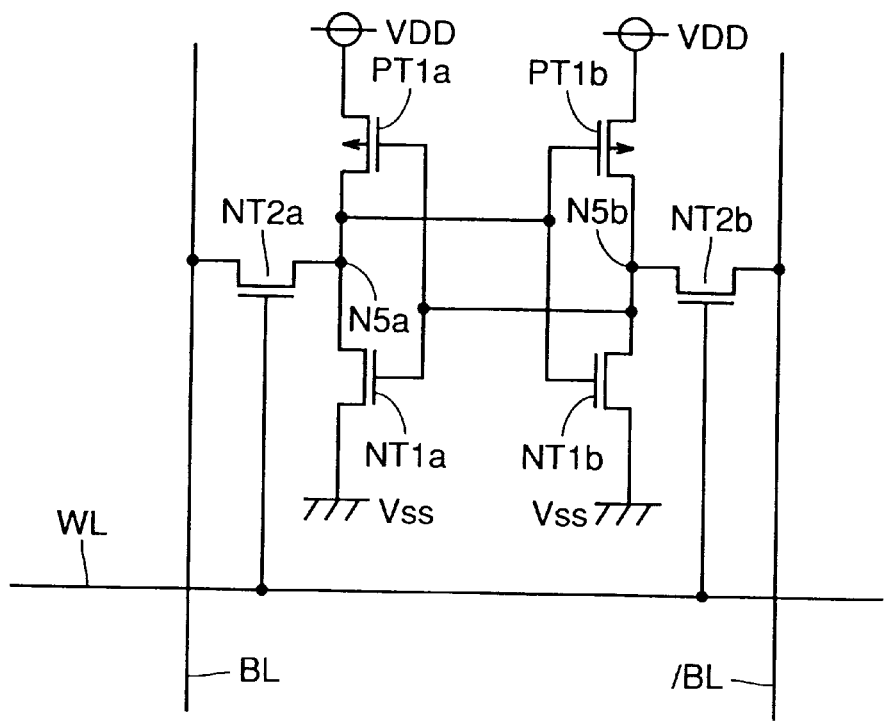
FIG. 4 is a circuit diagram showing a structure of the memory cell shown in FIG. 2.

FIGS. 3 and 4 are circuit diagrams illustrating examples of the structures of memory cells MC1–MC4 shown in FIG. 2. FIG. 3 illustrates a memory cell of high-resistance load type, and FIG. 4 illustrates a memory cell of CMOS type.

Referring to FIG. 3, the high-resistance load type memory cell includes N channel driver transistors NT1a and NT1b, N channel access transistors NT2a and NT2b, and load resistors ra and rb. N channel driver transistors NT1a and NT1b respectively have drains connected to storage nodes N5a and N5b, gates connected to drains of the other transistors, and sources connected to ground nodes Vss. N channel access transistors NT2a and NT2b respectively have one of the drain and source connected to storage nodes N5a and N5b, the other thereof connected to bit lines BL and /BL, and gates connected to word line WL. One end of each of load resistors ra and rb is connected to power supply node VDD, and the other thereof is connected to each of storage nodes N5a and N5b.

Referring to FIG. 4, the CMOS type memory cell is provided with P channel MOS transistors PT1a and PT1b in place of load resistors ra and rb shown in FIG. 3. P channel MOS transistors PT1a and PT1b respectively have drains connected to storage nodes N5a and N5b, gates connected to drains of the other transistors, and sources connected to power supply node VDD.

Figure 5:
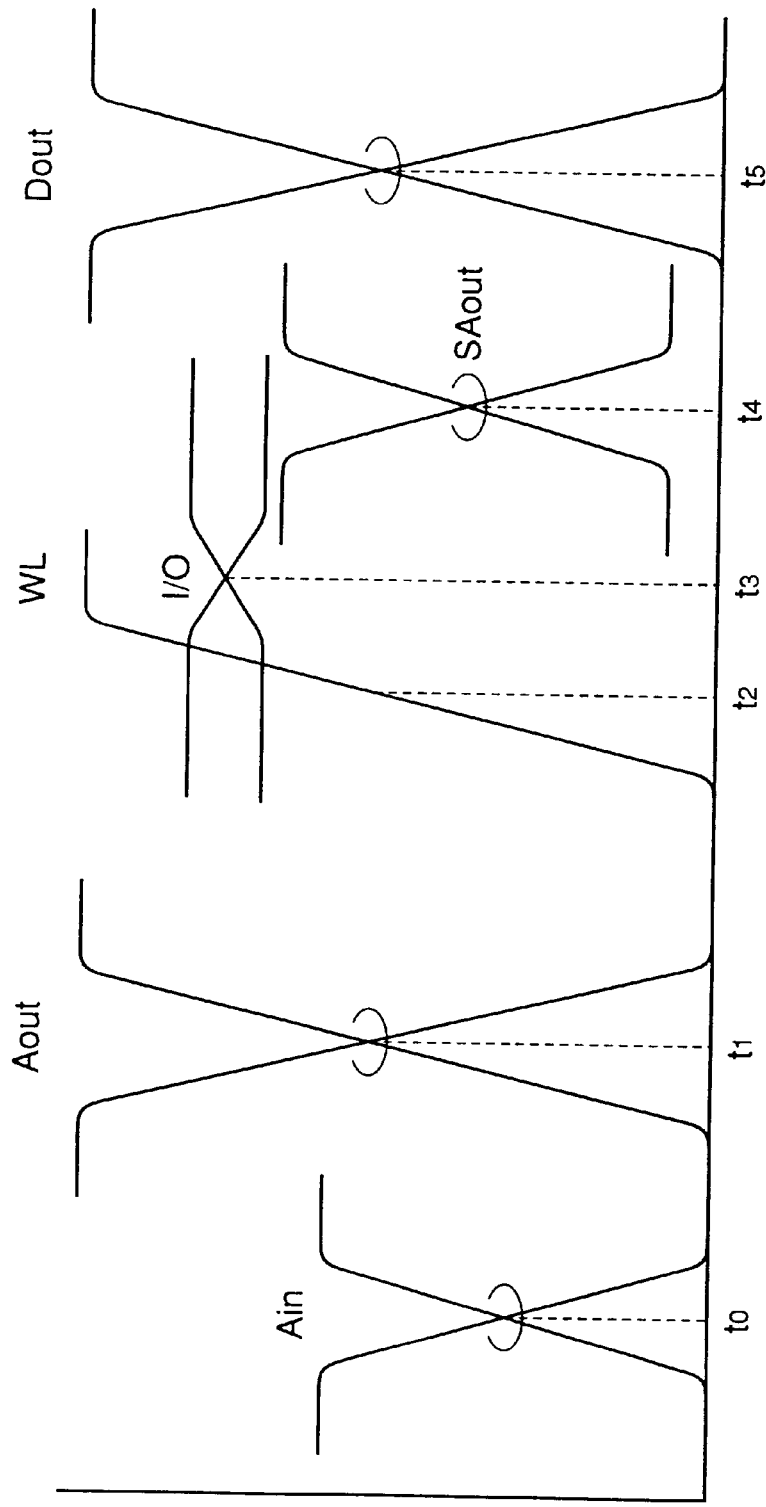
FIG. 5 is a timing chart representing a reading operation of data from the memory cell shown in FIG. 2 and a writing operation of data into the memory cell.

Referring to FIG. 5, a reading operation of data from a memory cell having the above-described structure, and a writing operation of data into the memory cell are described.

Reading of data from memory cell MC1 shown in FIG. 2 is now described.

At time t0, external address signal EAD corresponding to a row in which memory cell MC1 is placed is input to row address buffer RAB. At time t1, row address signal RAD is output from row address buffer RAB to row decoder RD in response to the supplied external address signal EAD. At time t2, word line WL1 to which memory cell MC1 is connected is raised to a select level (H level) by row decoder RD, and the other word line WL2 goes to a non-select level (L level).

Similarly, column address signal CAD corresponding to a column in which memory cell MC1 is placed is supplied to column decoder CD, multiplexer activation signal MPE1 corresponding to bit line pair BL1 and /BL1 to which memory cell MC1 is connected attains the select level (H level), and the other multiplexer activation signal MPE2 goes to the non-select level (L level). Consequently, only the transfer gate TFG1 connected to bit line pair BL1 and /BL1 is rendered conductive to connect only the selected bit line pair BL1 and /BL1 and to disconnect the other bit line pair BL2 and /BL2 to and from input/output line pair IO.

Suppose that storage node N5a of memory cell MC1 is at H level, and storage node N5b is at L level. In this case, one driver transistor NT1a of memory cell MC1 is in a non-conducting state, and the other driver transistor NT1b is in a conducting state. Since word line WL1 is at H level, access transistors NT2a and NT2b of memory cell MC1 are both in the conducting state. Accordingly, direct current is generated in a path extending from power supply node VDD through bit line load RN2, bit line /BL1, access transistor NT2b and driver transistor NT1b to ground node Vss. On the other hand, no direct current flows in a path extending from power supply node VDD through bit line load RN1, bit line BL1, access transistor NT2a and driver transistor NT1a to ground node Vss since driver transistor NT1a is in the non-conducting state. The potential on bit line BL1 where no direct current flows is represented as follows, supposing that the threshold voltage of bit line load transistors RN1–RN4 is Vth: potential on bit line BL1=(power supply voltage VDD)−(threshold voltage Vth). The potential on bit line /BL1 where the direct current flows is divided by the resistor due to the conducting resistance of driver transistor NT1$b$, access transistor NT2$b$, and bit line load RN2. As a result, the potential on bit line /BL1 decreases by ΔV compared with (power supply voltage VDD)−(threshold voltage Vth), represented as: (power supply voltage VDD)−(threshold voltage Vth)−ΔV. ΔV is referred to as bit line amplitude generally having the magnitude approximately from 50 mV to 500 mV that is adjusted by the magnitude of bit line loads RN1–RN4. Bit line amplitude ΔV is generated on input/output line pair IO via transfer gate TFG1 at time t3, amplified by sense amplifier SA at time t4, and further amplified by output data buffer OB at time t5 to be read as data output signal Dout supplied to any external unit. In reading operation, control by read/write control circuit RWC prevents input data buffer IB from driving input/output line pair 10.

In writing operation, the potential on one bit line to which data of L level is written is forcefully lowered to a low potential, and the potential on the other bit line is raised to a high potential in order to perform the writing operation. For example, if reverse data are written into memory cell MC1, input data buffer IB is used to set one of input/output line pair IO to L level, to set the other to H level, to set one bit line BL1 to L level, and to set the other bit line /BL1 to H level to perform the writing operation.

Figure 6:
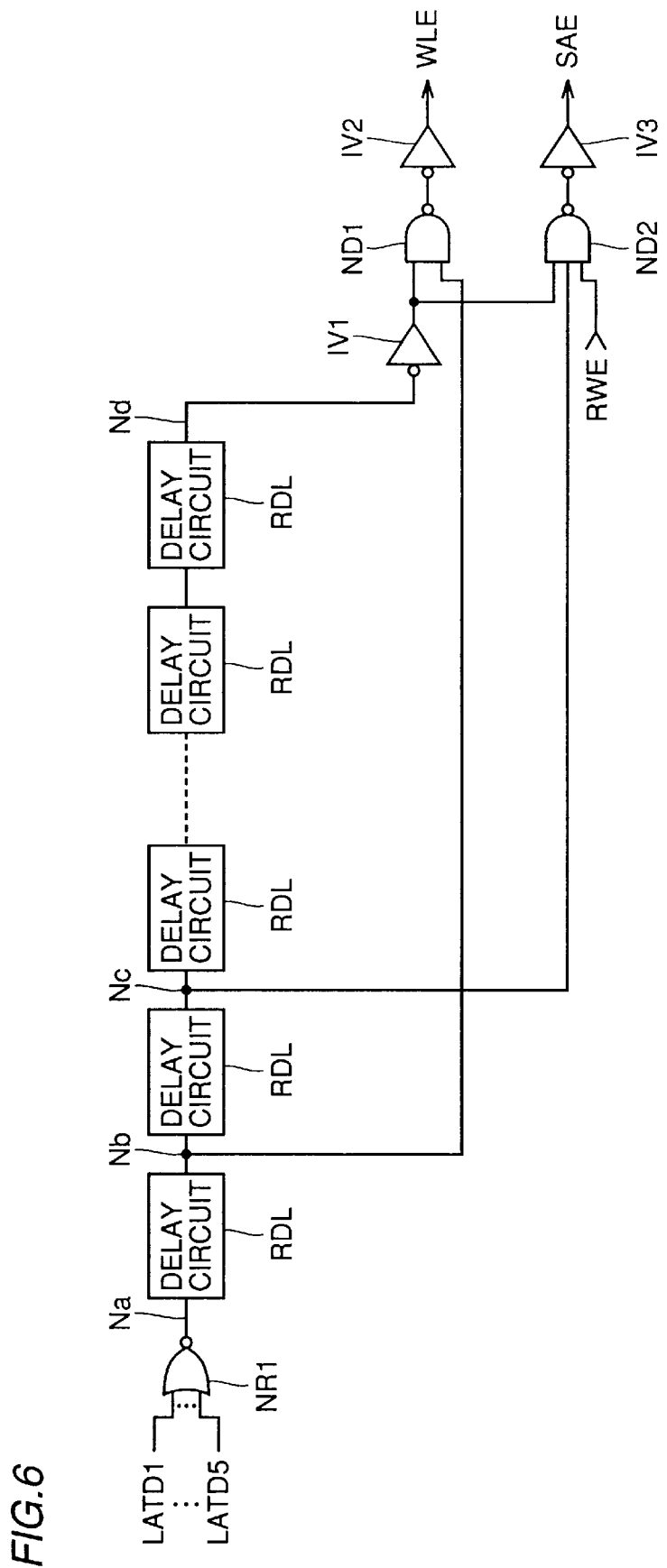
FIG. 6 is a block diagram showing a structure of a timing generator shown in FIG. 1.

FIG. 6 is a block diagram illustrating a structure of timing generator TG shown in FIG. 1. Referring to FIG. 6, timing generator TG includes an NOR circuit NR1, multiple stages of delay circuits RDLs, inverters IV1–IV3, and NAND circuits ND1 and ND2.

NOR circuit NR1 outputs NOR of pulse signals LATD1–LATD5 supplied from ATD buffers ATD1–ATD5. Each of the multiple stages of delay circuits RDLs delays the trailing edge of the input pulse signal to supply the delayed one to delay circuit RDL in the next stage. Delay circuit RDL in the first stage receives an output from NOR circuit NR1. Inverter IV1 inverts an output from delay circuit RDL in the last stage, or the voltage on node Nd. NAND circuit ND1 outputs NAND of an output from inverter IV1 and an output from the first stage delay circuit RDL. Inverter IV2 inverts the output from NAND circuit ND1 to output the inverted one as word line activation signal WLE. NAND circuit ND2 outputs NAND of the read/write enable signal RWE, the output from inverter IV1, and an output from delay circuit RDL in the second stage. Inverter IV3 inverts an output from NAND circuit ND2 to supply the inverted one as sense amplifier activation signal SAE.

Word line activation signal WLE output from the timing generator having the structure described above surely falls and maintains its state during the period in which a pulse signal output from the first stage delay circuit RDL falls and maintains its state. Similarly, sense amplifier activation signal SAE surely falls and maintains its state during the period in which a pulse signal output from the second stage delay circuit RDL falls and maintains its state.

Figure 7:
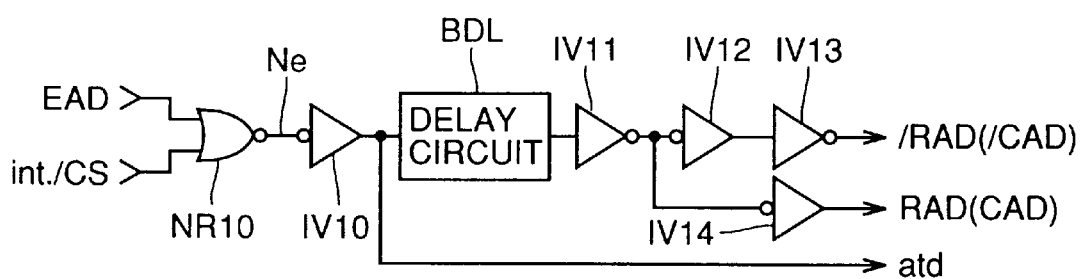
FIG. 7 is a block diagram illustrating a structure of a row address buffer shown in FIG. 1.

FIG. 7 is a block diagram illustrating a structure of row address buffer RAB shown in FIG. 1. Referring to FIG. 7, row address buffer RAB includes an NOR circuit NR10, a delay circuit BDL, and inverters IV11–IV14. NOR circuit NR10 outputs NOR of external address signal EAD and internal chip select signal int. /CS. Inverter IV10 inverts an output from NOR circuit NR10. Delay circuit BDL delays both of the leading edge and the trailing edge of a signal output from inverter IV10 by a prescribed time to output it.

Figure 8:
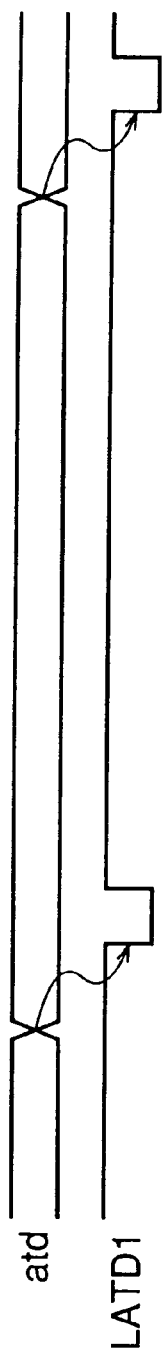
FIGS. 8A and 8B are timing charts representing an operation of an ATD buffer shown in FIG. 1.

Inverter IV11 inverts the output from delay circuit BDL. Inverter IV12 inverts an output from inverter IV11. Inverter IV13 inverts an output from inverter IV12 to output the inverted one as row address signal /RAD. Inverter IV14 inverts an output from inverter IV11 to output the inverted one as row address signal RAD. Output atd from inverter IV10 is supplied to ATD buffer ATD1. In response to the change of output atd, one-shot pulse signal LATD1 is output from ATD buffer ATD1 as shown in FIGS. 8A and 8B.

The delay time generated by delay circuit BDL in row address buffer RAB having the structure described above is adjusted such that row address signal RAD changes in the period in which word line activation signal WLE shown in FIG. 6 certainly falls and maintains its state.

Column address buffer CAB shown in FIG. 1 has a structure similar to that of row address buffer RAB shown in FIG. 7. In column address buffer CAB, outputs from inverters IV13 and IV14 are respectively column address signals /CAD and CAD. Output atd from inverter IV10 is supplied to ATD buffer ATD3.

Figure 9:
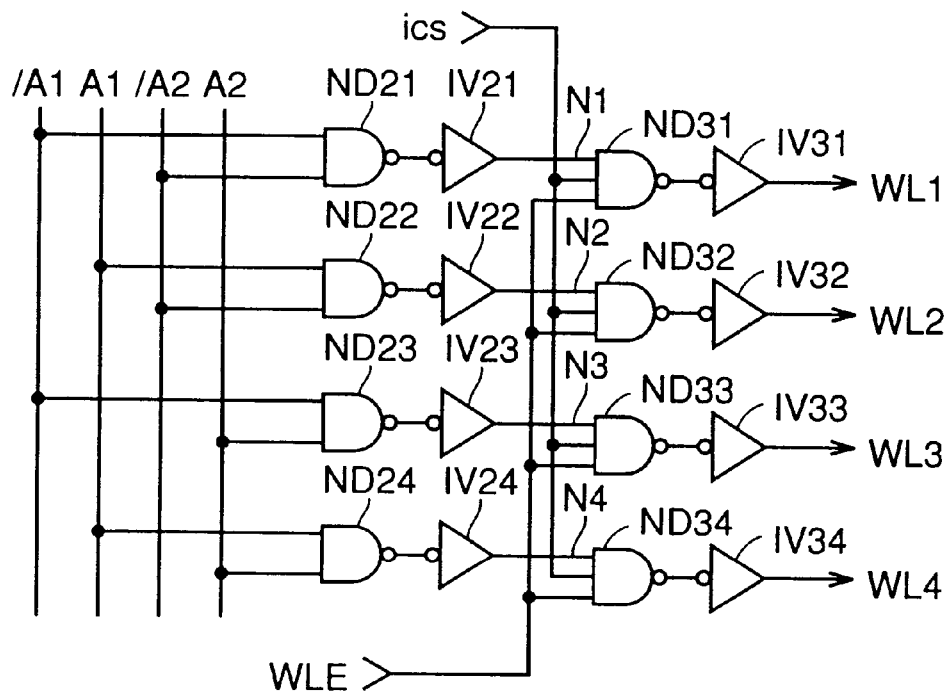
FIG. 9 is a block diagram showing a structure of a row decoder shown in FIG. 1.

FIG. 9 is a block diagram illustrating a structure of row decoder RD shown in FIG. 1. Referring to FIG. 9, row decoder RD includes NAND circuits ND21–ND24 and ND31–ND34, and inverters IV21–IV24 and IV31–IV34.

NAND circuits ND21–ND24 respectively output NAND of bit signals /A1 and /A2, A1 and /A2, /A1 and A2, and A1 and A2 of row address signals RAD and /RAD. Inverters IV21–IV24 respectively invert outputs from NAND circuits ND21–ND24. NAND circuits ND31–ND34 output NAND of outputs from corresponding inverters IV21–IV24, word line activation signal WLE, and an inverted signal iCS of internal chip select signal int. /CS. Inverters IV31–IV34 respectively invert outputs from NAND circuits ND31–ND34. Outputs from inverters IV31–IV34 are respectively connected to word lines WL1–WL4.

Figure 10:
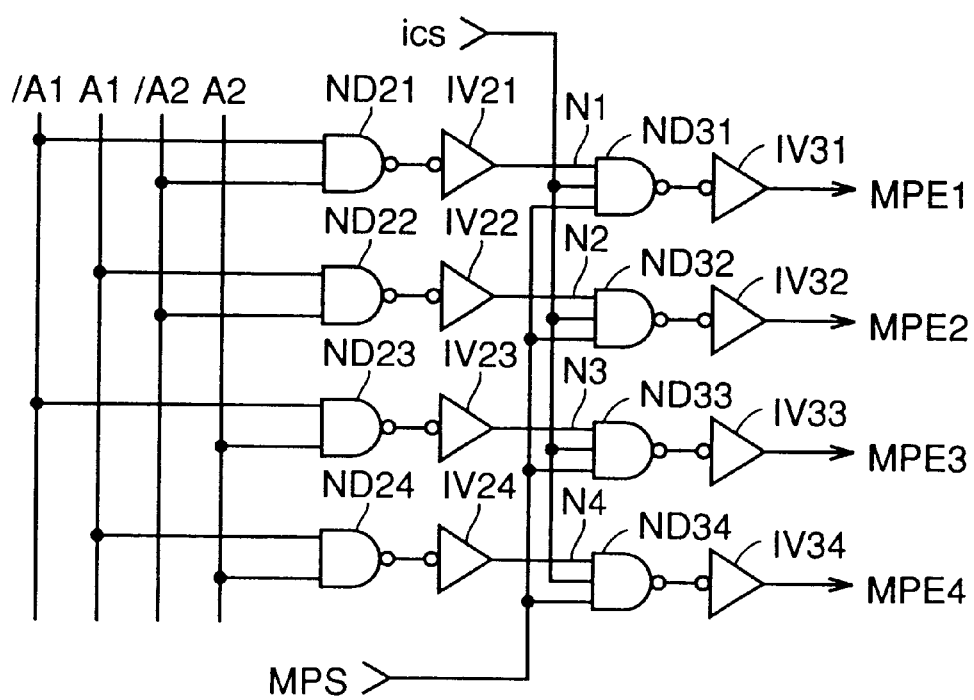
FIG. 10 is a block diagram illustrating a structure of a column decoder shown in FIG. 1.

FIG. 10 is a block diagram illustrating a structure of column decoder CD shown in FIG. 1. Referring to FIG. 10, in column decoder CD, inputs of NAND circuits ND21–ND24 shown in FIG. 9 are replaced respectively with bit signals /A1 and /A2, A1 and /A2, /A1 and A2, and A1 and A2 of column address signals CAD and /CAD, and word line activation signal WLE supplied to NAND circuits ND31–ND34 is replaced with multiplexer select signal MPS. Further, outputs from inverters IV31–IV34 are respectively multiplexer activation signals MPE1–MPE4.

An operation of the SRAM having the above-described structure is discussed below.

If the power supply voltage is relatively high, the pulse width of an output signal from delay circuit RDL is not so large and the pulse width of word line activation signal WLE is within the range of an address cycle as shown in FIGS. 21A–21R. Therefore, even if skew occurs between row address signals, a word line corresponding to a skew address does not rise since word line activation signal WLE is at L level.

Figure 11:
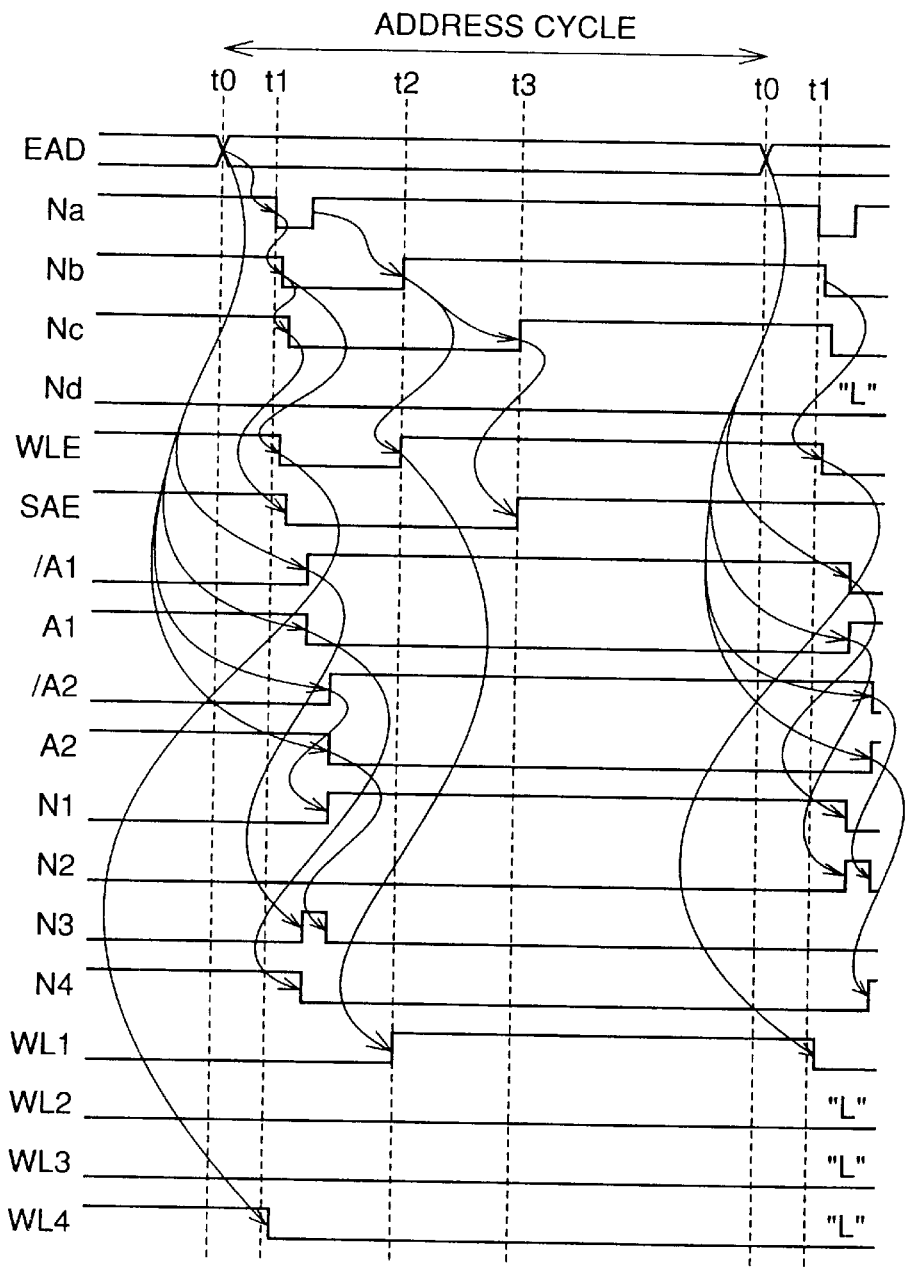
FIGS. 11A–11S are timing charts representing an operation of the SRAM according to the first embodiment of the present invention.

Referring to FIGS. 11A–11S, an operation for reduced supply voltage is described.

At time t0, external address signal EAD changes, and in response to the change, one-shot pulse signal LATD1 is generated by ATD buffer ATD1.

In response to pulse signal LATD1, LATD1 is supplied to delay circuit RDL in the first stage in timing generator TG, and the trailing edge of the pulse signal is delayed. The reduced supply voltage increases the width of the pulse signal output from delay circuit RDL in each stage, so that output node Nd from delay circuit RDL in the last stage always has L level. On the other hand, word line activation signal WLE always has L level during a period (the period from time t1 to t2) in which node Nb falls.

According to the change of external address signal EAD at time t0, bit signals A1 and A2 (A1 and A2 are at L level) of row address signal RAD corresponding to a word line to be selected (word line WL1) are supplied from row address buffer RAB to row decoder RD.

If there is skew between bit signals A1 and A2 of row address signal RAD as represented by FIGS. 11A–11S, the skew causes node N3 to rise at an instant. However, word line activation signal WLE is at L level, so that word line WL3 is never activated.

Bit signals A1 and A2 of row address signal RAD change during the period in which word line activation signal WLE is at L level. Therefore, even if skew occurs, a non-selected word line is never activated.

According to the first embodiment, word line activation signal WLE is surely at L level during a prescribed period, and in this period, bit signals A1 and A2 of row address signal RAD change. Consequently, even if skew is generated between bit signals A1 and A2 of row address signal RAD, a non-selected word line is never activated. In addition, charging and discharging current that is wastefully used can be reduced. This effect can be obtained for the higher supply voltage as well as for the lower supply voltage. Further, word line activation signal WLE determines rising of the word line to eliminate a difference of access time caused depending on an input address.

An output from delay circuit RDL in the first stage is shown as an input to NAND circuit ND1 in this embodiment. However, the output may be any from delay circuit RDL in any stage other than the first stage. This arrangement allows the period in which word line activation signal WLE is at L level to be adjusted to a prescribed time.

Although only row address buffer RAB and row decoder RD are herein described, the description is similarly applied to column address buffer CAB and column decoder CD.

[Second Embodiment]

In the SRAM according to the first embodiment, row address signal RAD output from row address buffer RAB shown in FIG. 7 is fixed at H level when internal chip select signal int. /CS is inactive. In this case, if internal chip select signal int. /CS is rendered active, a word line which should not be selected could be activated to cause erroneous writing. The second embodiment is devised to solve this problem.

Figure 12:
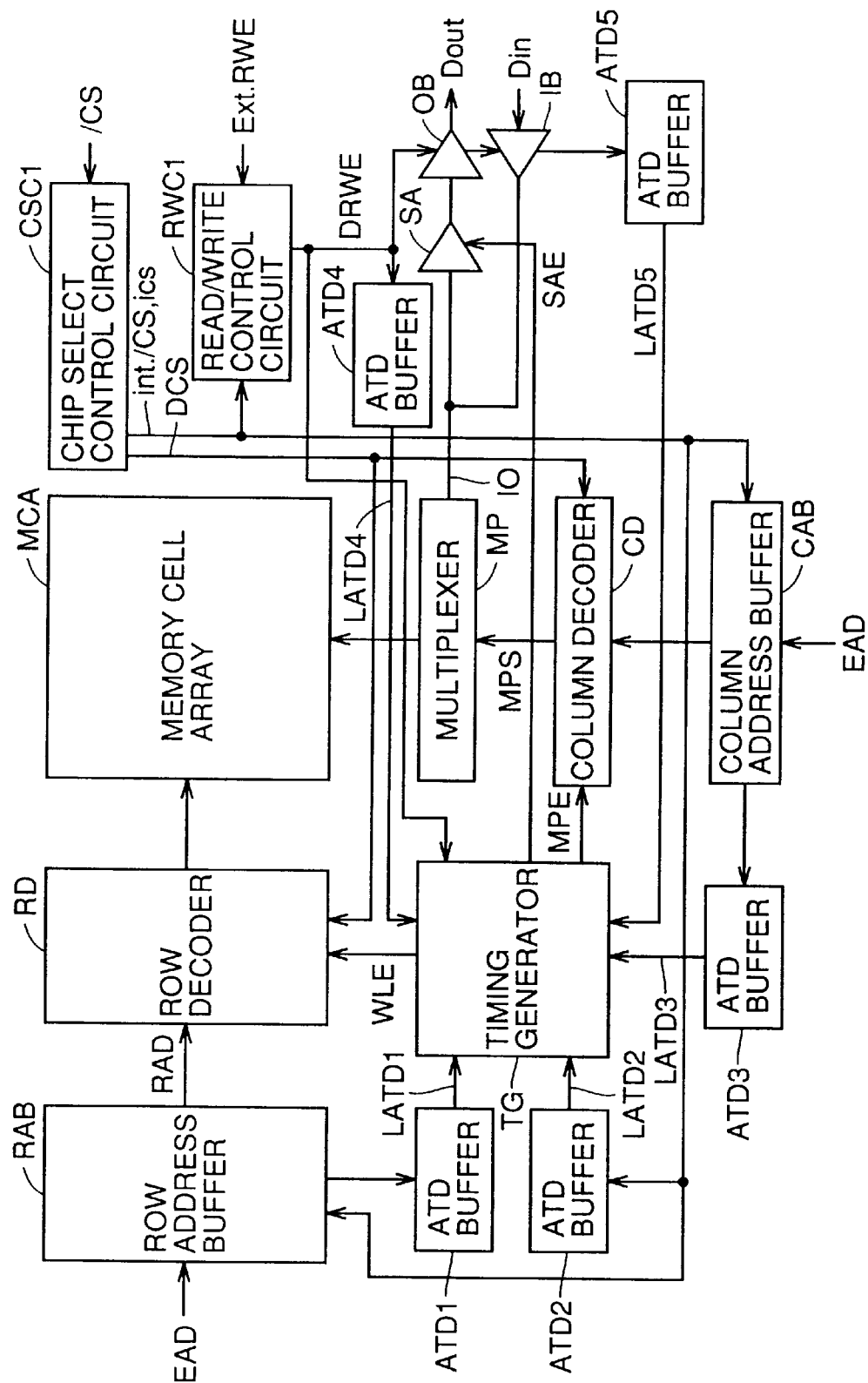
FIG. 12 is a block diagram illustrating an entire structure of an SRAM according to the second embodiment of the present invention.

FIG. 12 is a block diagram illustrating an entire structure of an SRAM according to the second embodiment. Referring to FIG. 12, the SRAM includes a chip select control circuit CSC1 in place of chip select control circuit CSC, and includes a read/write control circuit RWC1 in place of read/write control circuit RWC. Chip select control circuit CSC1 generates internal chip select signal int. /CS and delay chip select signal DCS in response to chip select signal /CS. Read/write control circuit RWC1 generates delay read/write enable signal DRWE in response to external read/write enable signal Ext. RWE. Row decoder RD and column decoder CD are activated in response to delay chip select signal DCS, and read/write control circuit RWC1, row address buffer RAB, and column address buffer CAB are activated in response to internal chip select signal int. /CS.

Figure 13:
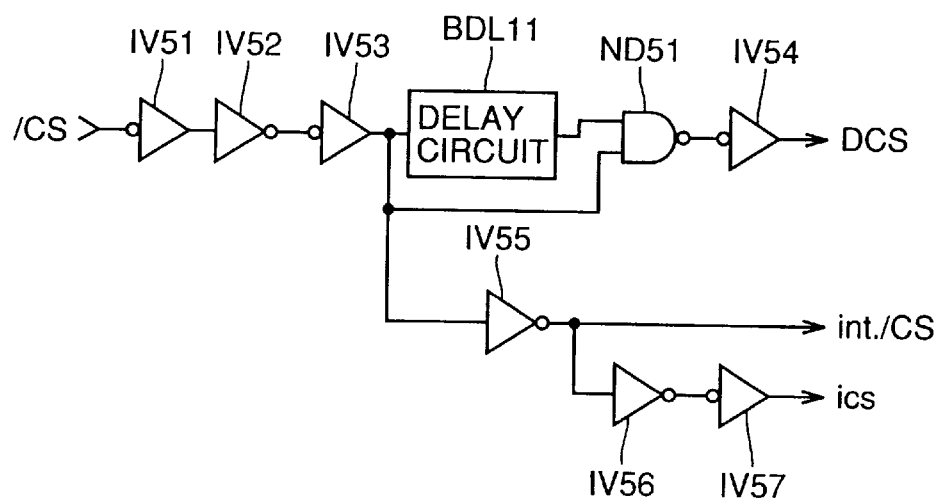
FIG. 13 is a block diagram illustrating a structure of a chip select control circuit shown in FIG. 12.

FIG. 13 is a block diagram illustrating a structure of chip select control circuit CSC1 shown in FIG. 12. Referring to FIG. 13, chip select control circuit CSC1 includes inverters IV51–IV57, a delay circuit BDL11, and an NAND circuit ND51. Inverter IV51 inverts chip select signal /CS. Inverter IV52 inverts an output from inverter IV51. Inverter IV53 inverts an output from inverter IV52. Delay circuit BDL11 delays the leading edge and the trailing edge of an output from inverter IV53 by a prescribed time to output the delayed one. NAND circuit ND51 outputs NAND of the output from delay circuit BDL11 and the output from inverter IV53. Inverter IV54 inverts an output from NAND circuit ND51 and outputs the inverted one as delay chip select signal DCS. The delay time in delay circuit BDL11 is adjusted to allow delay chip select signal DCS to change in the period in which word line activation signal WLE is at L level. Inverter IV55 inverts the output from inverter IV53 and outputs the inverted one as internal chip select signal int. /CS. Inverter IV56 inverts an output from inverter IV55. Inverter IV57 inverts an output from inverter IV56 and outputs the inverted one as internal chip select signal iCS. Internal chip select signal iCS is supplied to ATD buffer ATD2.

Figure 14:
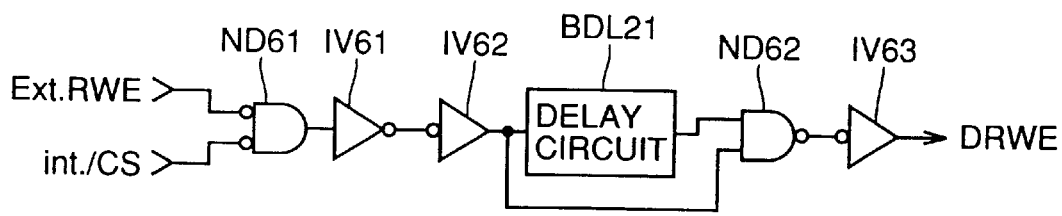
FIG. 14 is a block diagram illustrating a structure of a read/write control circuit shown in FIG. 12.

FIG. 14 is a block diagram illustrating a structure of read/write control circuit RWC1 shown in FIG. 12. Referring to FIG. 14, read/write control circuit RWC1 includes NAND circuits ND61 and ND62, inverters IV61–63, and a delay circuit BDL21. NAND circuit ND61 outputs NAND of external read/write enable signal Ext. RWE and internal chip select signal int. /CS. Inverter IV61 inverts the output from NAND circuit ND61. Inverter IV62 inverts the output from inverter IV61. Delay circuit BDL21 delays the leading edge and the trailing edge of an output from inverter IV62 by a prescribed time to output the delayed one. NAND circuit ND62 outputs NAND of the output from delay circuit BDL21 and an output from inverter IV62. Inverter IV63 inverts the output from NAND circuit ND62 and outputs the inverted one as delay read/write enable signal DRWE. The delay time in delay circuit BDL21 is adjusted such that delay read/write enable signal DRWE changes in the period in which word line activation signal WLE is at L level.

Figure 15:
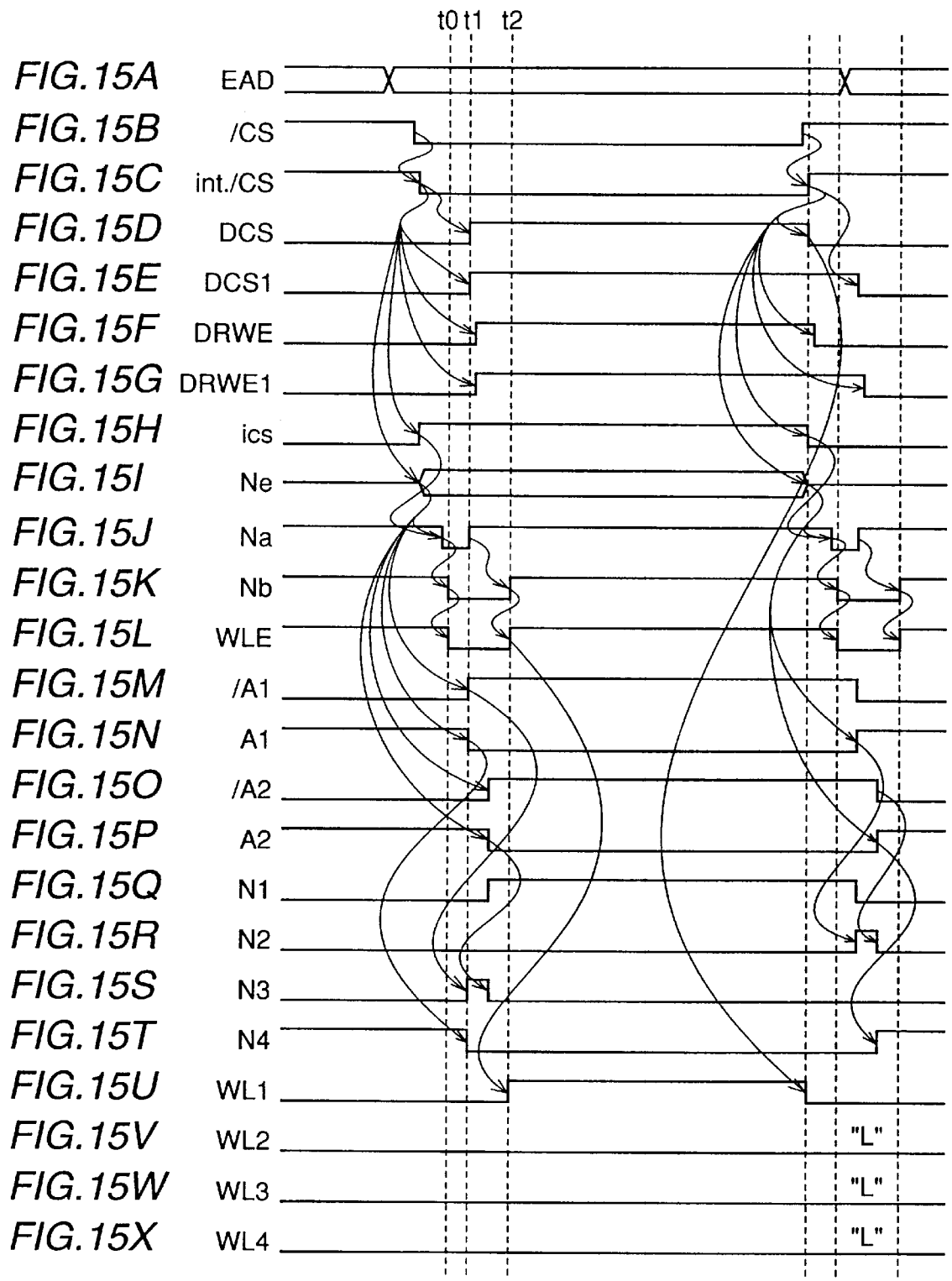
FIGS. 15A–15X are timing charts representing an operation of the SRAM according to the second embodiment of the present invention.

An operation of the SRAM having the structure described above is discussed below in conjunction with FIGS. 15A–15X.

In response to falling of internal chip select signal int. /CS, row address buffer RAB is activated, and word line activation signal WLE which is at L level for a prescribed period is supplied from timing generator TG to row decoder RD in a manner similar to that of the first embodiment.

At time t1 between time t0 and time t2, delay chip select signal DCS changes its level from L to H. In the second embodiment, instead of chip select signal iCS shown in FIGS. 9 and 10, delay chip select signal DCS is supplied to row decoder RD and column decoder CD.

In the time period from time t0 to t2, delay read/write enable signal DRWE changes its state from L level to H level. Accordingly, data output buffer OB and data input buffer IB are activated.

At time t2, word line activation signal WLE changes its state from L level to H level. In response to this change, a word line is selected in a manner similar to that of the first embodiment. In this case, any word line other than the selected word line WL1 is never activated.

According to the second embodiment, delay circuits BDL11 and BDL21 are provided in chip select control circuit CSC1 and read/write control circuit RWC1, and accordingly delay chip select signal DCS and delay read/write enable signal DRWE change in the period in which word line activation signal WLE is at L level. Therefore, a word line which should not be selected is never activated and erroneous writing is prevented. Further, charging and discharging current which is wastefully consumed can be reduced since a word line corresponding to a non-selected address is not activated.

Figure 16:
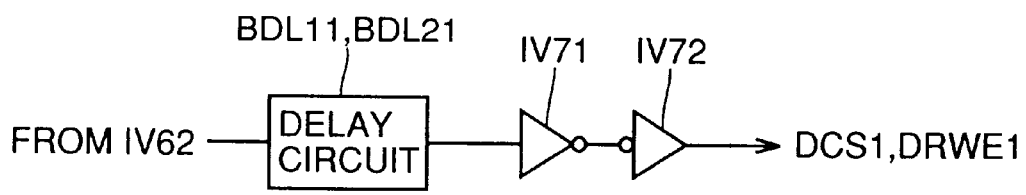
FIG. 16 is a block diagram illustrating a modification of the chip select control circuit in FIG. 13 and the read/write control circuit in FIG. 14.
Figure 17:
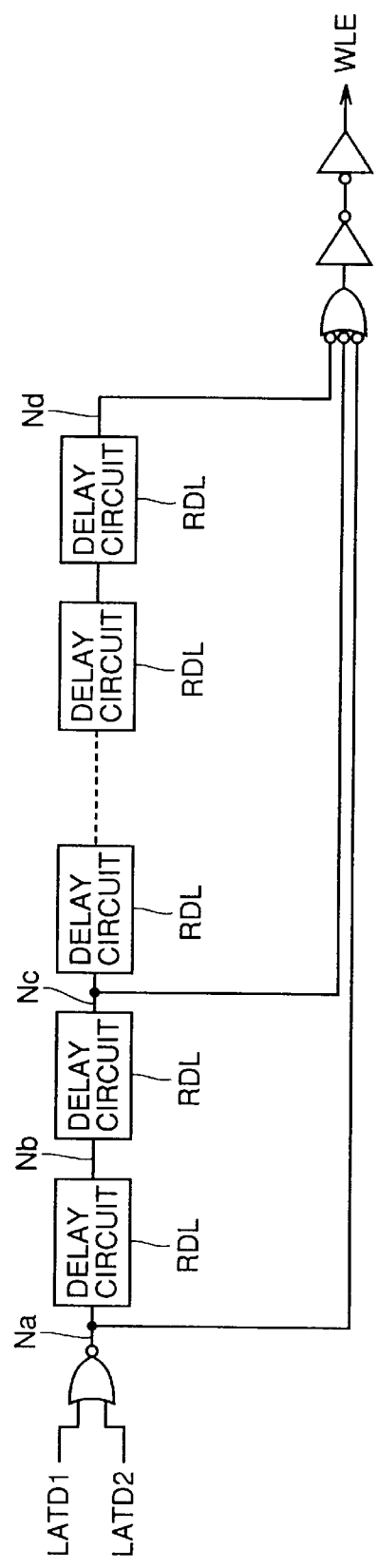
FIG. 17 is a block diagram illustrating a structure of a timing generator in a conventional SRAM.
Figure 18:
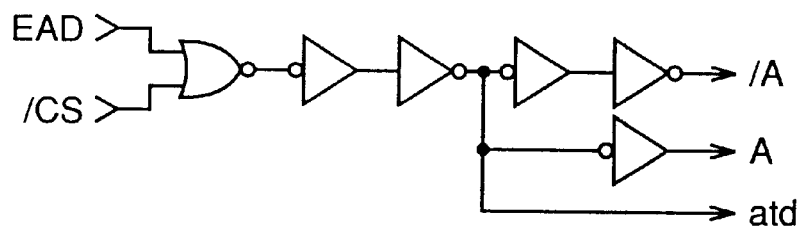
FIG. 18 is a block diagram illustrating a structure of an address buffer in the conventional SRAM.
Figure 19:
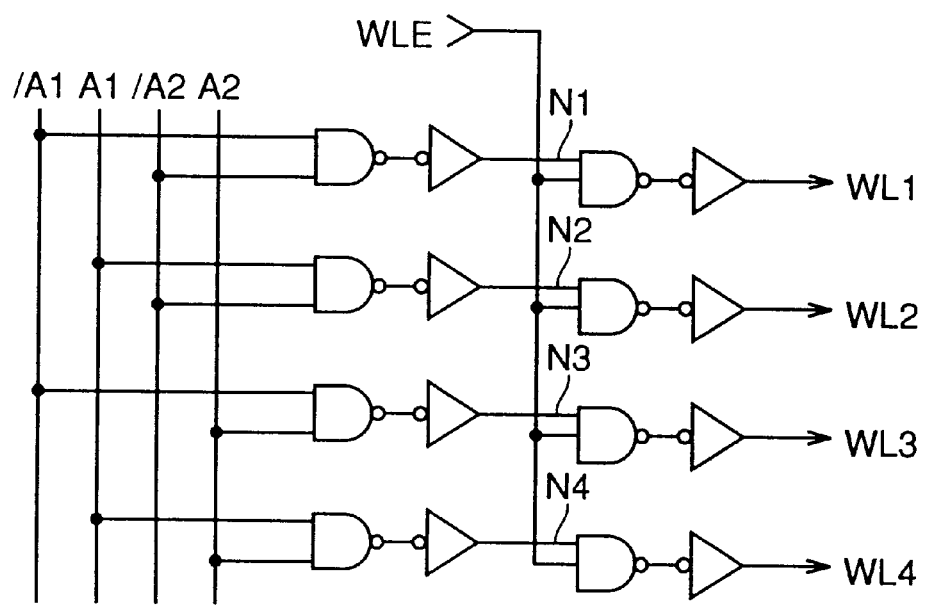
FIG. 19 is a block diagram illustrating a structure of a row decoder in the conventional SRAM.
Figure 20:
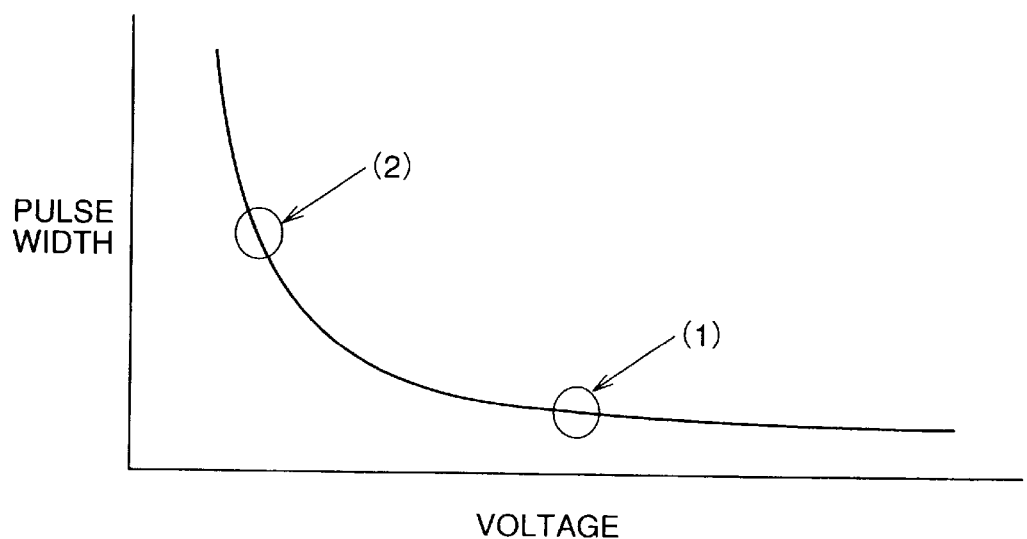
FIG. 20 shows a relation between the power supply voltage and the pulse width of an output signal in a delay circuit.

In place of NAND circuit ND51 and inverter IV54 in FIG. 13 and NAND circuit ND62 and inverter IV63 in FIG. 14, inverters IV71 and IV72 shown in FIG. 16 may be used. In this case, an output signal from inverter IV72 is delay chip select signal DCS1 or delay read/write enable signal DRWE1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns;
   an address buffer generating an internal address signal in response to an external address signal;
   an address transition detect circuit generating a pulse signal in response to transition of said external address signal;
   a first delay circuit delaying the trailing edge of the pulse signal supplied from said address transition detect circuit to generate a drive signal;
   a drive signal inactivate circuit inactivating said drive signal for a prescribed period; and
   a decoder selecting a row or a column of said memory cell array in response to said internal address signal when said drive signal is active,
   said address buffer including a second delay circuit which delays said external address signal by a prescribed time to output the delayed signal as said internal address signal such that said internal address signal changes in a period in which said drive signal is inactive.

2. The semiconductor memory device according to claim 1, wherein
   said decoder is a row decoder which selects a row of said memory cell array in response to said internal address signal when said drive signal is active.

3. The semiconductor memory device according to claim 1, wherein
   said decoder is a column decoder which selects a column of said memory cell array in response to said internal address signal when said drive signal is active.

4. The semiconductor memory device according to claim 1, wherein
   said first delay circuit includes multiple stages of delay circuits that delay the trailing edge of the pulse signal from said address transition detect circuit, and
   said drive signal inactivate circuit includes a logic circuit which receives an output from one of said multiple stages of delay circuits that is in an intermediate stage and an output from a delay circuit in the last stage.

5. The semiconductor memory device according to claim 1, further comprising a third delay circuit which delays a chip select signal by a prescribed time to output the delayed signal such that the delayed chip select signal as an output signal changes in a period in which said drive signal is inactive, wherein
   said address buffer generates said internal address signal in response to said external address signal when said chip select signal is active, and fixes said internal address signal when said chip select signal is inactive, and
   said decoder selects a row or a column of said memory cell array in response to said internal address signal when said delayed chip select signal and said drive signal are active.

6. The semiconductor memory device according to claim 5, wherein
   said decoder is a row decoder which selects a row of said memory cell array in response to said internal address signal when said delayed chip select signal and said drive signal are active.

7. The semiconductor memory device according to claim 5, wherein
   said decoder is a column decoder which selects a column of said memory cell array in response to said internal address signal when said delayed chip select signal and said drive signal are active.

8. The semiconductor memory device according to claim 5, further comprising:
   a fourth delay circuit which delays a read/write enable signal by a prescribed time to output the delayed signal such that the delayed read/write enable signal as an output signal changes in a period in which said drive signal is inactive, when said chip select signal is active; and
   an output buffer which buffers a data signal from a memory cell and outputs the buffered signal when said delayed read/write enable signal is active.

9. The semiconductor memory device according to claim 5, further comprising:
   a fourth delay circuit which delays a read/write enable signal by a prescribed time to output the delayed signal such that the delayed read/write enable signal as an output signal changes in a period in which said drive signal is inactive, when said chip select signal is active; and
   an input buffer which buffers an externally supplied data signal when said delayed read/write enable signal is active.

* * * * *